(12) United States Patent
Arai et al.

(10) Patent No.: US 6,741,125 B2
(45) Date of Patent: May 25, 2004

(54) HIGH FREQUENCY POWER AMPLIFIER AND WIRELESS COMMUNICATION MODULE

(75) Inventors: Satoshi Arai, Komoro (JP); Tsuyoshi Shibuya, Tokyo (JP); Hitoshi Sekiguchi, Komoro (JP); Nobuhiro Matsudaira, Chigasaki (JP); Tomio Furuya, Tamamura (JP); Masashi Maruyama, Komoro (JP); Yasushi Ohyama, Komoro (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/337,819

(22) Filed: Jan. 8, 2003

(65) Prior Publication Data

US 2003/0137347 A1 Jul. 24, 2003

Related U.S. Application Data

(63) Continuation of application No. 10/294,597, filed on Nov. 15, 2002.

(30) Foreign Application Priority Data

Dec. 12, 2001 (JP) .................................... 2001-378117
Jan. 28, 2002 (JP) .................................... 2002-018646

(51) Int. Cl.$^7$ ................................................. H03G 3/20
(52) U.S. Cl. ........................................ 330/66; 330/285
(58) Field of Search ........................... 330/66, 127, 129, 330/133, 297, 285

(56) References Cited

U.S. PATENT DOCUMENTS 6,172,567 B1 * 1/2001 Ueno et al. ............. 330/133 X

FOREIGN PATENT DOCUMENTS

JP    2002-151310    5/2000

* cited by examiner

*Primary Examiner*—Steven J Mottola
(74) *Attorney, Agent, or Firm*—Mattingly, Stanger & Malur, P.C.

(57) ABSTRACT

The present invention provides a high frequency power amplifier of an open-loop type, which outputs a signal having a level corresponding to an output level required under control of a power supply voltage for each output power FET, based on a control signal for the output level. The high frequency power amplifier is provided with a bias voltage generating circuit which generates a gate bias voltage of each output power FET according to an output voltage of a power control circuit for controlling the power supply voltage for the output power FET, based on the control signal for the output level.

7 Claims, 8 Drawing Sheets

HIGH FREQUENCY POWER AMPLIFIER AND WIRELESS COMMUNICATION MODULE

This is a continuation application of U.S. Ser. No. 10/294,597, filed Nov. 15, 2002.

BACKGROUND OF THE INVENTION

The present invention relates to a high frequency power amplifier and a technology effective for application to a wireless communication apparatus such as a cellular phone or the like with the high frequency power amplifier built therein, and particularly to a technology for speeding up an open-loop type high frequency power amplifier capable of controlling a power supply voltage for output power FETs constituting the high frequency power amplifier to thereby control output power and improving efficiency thereof at a low output.

An output section on the transmitting side of a wireless communication apparatus (mobile communication apparatus) such as a mobile phone, a cellular phone or the like has built therein a module (called an "RF power module") in which a high frequency power amplifier (generally provided in a multistage configuration) using semiconductor amplifying elements such as MOSFETs (field effect transistors), a GaAs-MESFET, etc. and its bias circuit are integrated into one.

Meanwhile, a cellular phone generally has a system configured in such a manner as to change an output (transmission power) so as to adapt to an ambient environment according to power level designation information sent from a base station in accordance with a use environment to thereby start a call and in such a way as not to cause interference between the cellular phone and other cellular phones.

An RF power module of a transmission-side output stage of a portable phone of a cellular type or system such as a North American Standard System of a 900 MHz band, an European GSM (Global System for Mobile Communication) system or the like is provided with an APC (Automatic Power Control) circuit which effects feedback on a gate bias circuit for generating a gate bias voltage of each output power element so as to detect a DC level of an output and provide output power necessary for a call (e.g., Unexamined Patent Publication No. 2000-151310). Such a control system is generally called a "closed-loop type or system".

SUMMARY OF THE INVENTION

However, the system for controlling the output power by the APC circuit is accompanied by a problem that a circuit scale becomes large and a packaging density is decreased. Therefore, there is provided a system for controlling a power supply voltage for each output power FET based on an output level designation signal corresponding to a required output level to thereby cause a signal having a level corresponding to the required output level to be outputted from a high frequency power amplifier. This system is called an "open-loop system" and has the advantage of being capable of reducing a circuit scale as compared with the close-loop system.

Meanwhile, the conventional high frequency power amplifier of open-loop system has a problem in that even if linearity of its output is good, the efficiency at a low output is poor. It was found that a problem also arose in that the speed of response to the output level designation signal was slow. It has been cleared that when a power supply voltage for each output power FET is changed based on amplitude information about a transmit signal to thereby effect amplitude control particularly in a high frequency power amplifier employed in a communication apparatus in which voice-signal communications are performed according to a GMSK (Gaussian filtered Minimum Shift Keying) modulation system for phase-shifting the phase of a carrier wave according to transmit data, and data communications are performed according to an EDGE (Enhanced Data Rates for GMS Evolution) modulation system in which an amplitude shift is further added to a phase shift in GMSK modulation, the speed of response in the circuit is not sufficient.

An object of the present invention is to provide a high frequency power amplifier capable of performing open-loop type transmission, which is satisfactory in output linearity and excellent in efficiency at a low output.

Another object of the present invention is to provide a high frequency power amplifier excellent in response to a control signal where a power supply voltage for each output power FET is controlled to control an output level.

A further object of the present invention is to provide a multifunction type high frequency power amplifier capable of performing transmission based on an EDGE modulation system for changing a power supply voltage for each output power FET based on amplitude information about a transmit signal to thereby effect amplitude control in addition to a GMSK modulation system for phase-shifting the phase of a carrier wave according to transmit data.

A still further object of the present invention is to provide a high frequency power amplifier which makes it possible to increase a call time of a wireless communication apparatus and the life of a battery.

The above, other objects and novel features of the present invention will become apparent from the description of the present specification and the accompanying drawings.

Summaries of typical ones of the inventions disclosed in the present application will be explained in brief as follows:

An open-loop type high frequency power amplifier wherein a power supply voltage for each output power FET is controlled based on a signal for specifying or designating an output level to thereby output a signal having a level corresponding to the required output level, is provided with a bias voltage generating circuit which generates a gate bias voltage for each output power FET according to a voltage outputted from a power control circuit for controlling the power supply voltage for each output power FET based on the signal for designating the output level.

According to the above means, a high frequency power amplifier can be obtained which is capable of improving efficiency at a low output while output's linearity is being ensured. Thus, since the efficiency at a low output relatively high in the frequency of its use is enhanced, the total power consumption is reduced, and a wireless communication apparatus such as a cellular phone or the like using this type of high frequency power amplifier is capable of increasing a call time and the life of a battery used therefor.

Preferably, the power control circuit, which controls the power supply voltage for each output power FET based on the output level designation signal, makes use of a circuit which comprises an operational amplifier circuit for amplifying the output level designation signal and a MOSFET whose gate is controlled based on the output of the operational amplifier circuit to thereby output a power supply voltage for the output power FETs from a drain thereof and which feeds back the drain voltage of the MOSFET to the operational amplifier circuit to thereby generate a desired power supply voltage. There is further provided a buffer circuit having a bipolar transistor as an active element between the operational amplifier circuit and a gate terminal of the MOSFET which outputs the power supply voltage for the output power FETs. Consequently, a high frequency power amplifier is obtained which improves response to a control signal and is also capable of performing transmission based on an EDGE modulation system for changing a power supply voltage for each output power FET based on amplitude information about a transmit signal to thereby effect amplitude control.

Further, preferably, a phase compensating circuit comprising a CR circuit or the like in which a capacitor and a resistor are connected in parallel, is provided between the operational amplifier circuit and the gate terminal of the MOSFET for outputting the power supply voltage for each output power FET. Thus, a phase allowance is developed in the power control circuit and hence distortion of an output can be reduced.

Bias voltage switching means is provided which makes it possible to supply a bias voltage corresponding to a required output level to the high frequency power amplifier as an alternative to the bias voltage outputted from the bias voltage generating circuit. Thus, when a signal phase-modulated by the EDGE modulation system is inputted to the high frequency power amplifier and an output's amplitude control information signal is inputted to the power control circuit as an alternative to the signal for designating the output level, the bias voltage corresponding to the required output level is supplied to the high frequency power amplifier as an alternative to the bias voltage outputted from the bias voltage generating circuit, whereby a system capable of performing transmission based on the EDGE modulation system can be configured, and a bias voltage corresponding to an output level is supplied to the high frequency power amplifier upon such transmission to thereby allow the operation of the high frequency power amplifier.

DETAILED DESCRIPTION OF THE PREFERRED EMBODIMENTS

Figure 1:
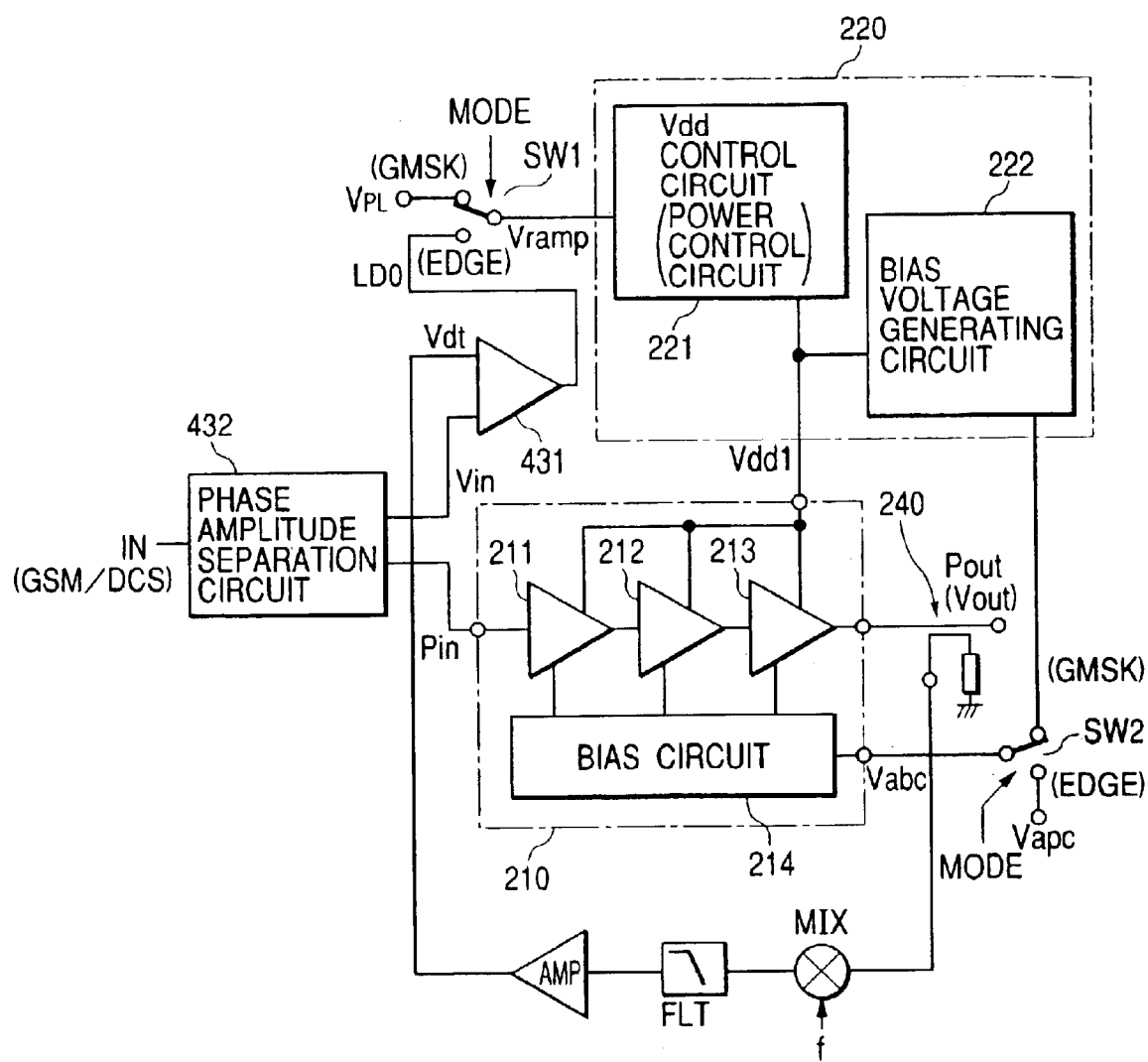
FIG. 1 is a block diagram showing a schematic configuration of a high frequency power amplifier according to the present invention.

Preferred embodiments of the present invention will hereinafter be described in detail with reference to the accompanying drawings. Incidentally, components each having the same function in all drawings for describing the embodiments of the present invention will be described with the same reference numerals.

FIG. 1 shows a schematic configuration of an embodiment illustrative of a high frequency power amplifier according to the present invention. In FIG. 1, reference numeral 210 indicates a high frequency power amplifier, and reference numeral 220 indicates an operating voltage control circuit for generating a voltage to be applied to the high frequency power amplifier 210, respectively. The high frequency power amplifier 210 comprises amplifying stages 211, 212 and 213 corresponding to three stages, and a bias circuit 214 for applying bias voltages Vg1, Vg2 and Vg3 to these amplifying stages respectively. The operating voltage control circuit 220 comprises a power control circuit 221 for generating a source voltage or power supply voltage Vdd1 applied to drain terminals of output power FETs of the respective amplifying stages constituting the high frequency power amplifier 210, and a bias voltage generating circuit 222 for generating a control voltage Vabc for the bias circuit 214.

In the present embodiment, the power control circuit 221 generates a power supply voltage Vdd1 to be applied to the drain terminals of the output power FETs of the high frequency power amplifier 210, based on an output level designation signal VPL for designating or specifying an output level supplied from an unillustrated base band circuit. The bias voltage generating circuit 222 is configured so as to generate a bias voltage Vabc, based on the power supply voltage Vdd1 generated by the power control circuit 221. The base band circuit generates an output level designation signal VPL, based on an output level determined according to the distance to a base station, for example, i.e., the strength of a radio wave.

Further, in the present embodiment, a selector switch SW1 for allowing a signal LDO equivalent to amplitude information about transmit data supplied from a comparator 431 to be inputted to the power control circuit 221 as an alternative to the output level designation signal VPL is provided to enable transmission based on an EDGE modulation scheme or system in addition to transmission based on a GMSK modulation system.

The switch SW1 is provided for an unillustrated modem circuit and changed over according to a mode signal MODE for designating or specifying, e.g., a modulation scheme or system. The comparator 431 is configured in such a manner as to compare an amplitude information signal Vin supplied from a phase amplitude separation circuit 432 for separating a transmit signal IN into a phase information signal Pin and the amplitude information signal Vin, and a detected signal Vdt supplied from an output level detecting coupler 240 provided on the output side of the high frequency power amplifier 210 and thereby output a signal corresponding to the difference in potential therebetween. Thus, such feedback control as to cause the output level of the high frequency power amplifier 210 to coincide with the level of the amplitude information signal Vin is performed. Incidentally, the output of the coupler 240 is frequency-converted by a mixer MIX, which in turn is supplied to the comparator 431 as the detected signal Vdt through a filter FLT and an amplifier AMP.

Incidentally, since no output level designation signal VPL is inputted to the power control circuit 221 in an EDGE modulation mode, the bias voltage generating circuit 222 is not capable of generating a bias voltage Vabc corresponding to a necessary output level, based on the voltage Vdd1 supplied from the power control circuit 221. Therefore, there is provided a selector switch SW2 for supplying an output level control voltage Vapc supplied from the base band circuit or the modem circuit to the bias circuit 214 as an alternative to the voltage from the bias voltage generating circuit 222. The selector switch SW2 performs switching according to the mode signal MODE for designating the modulation system.

Figure 2:
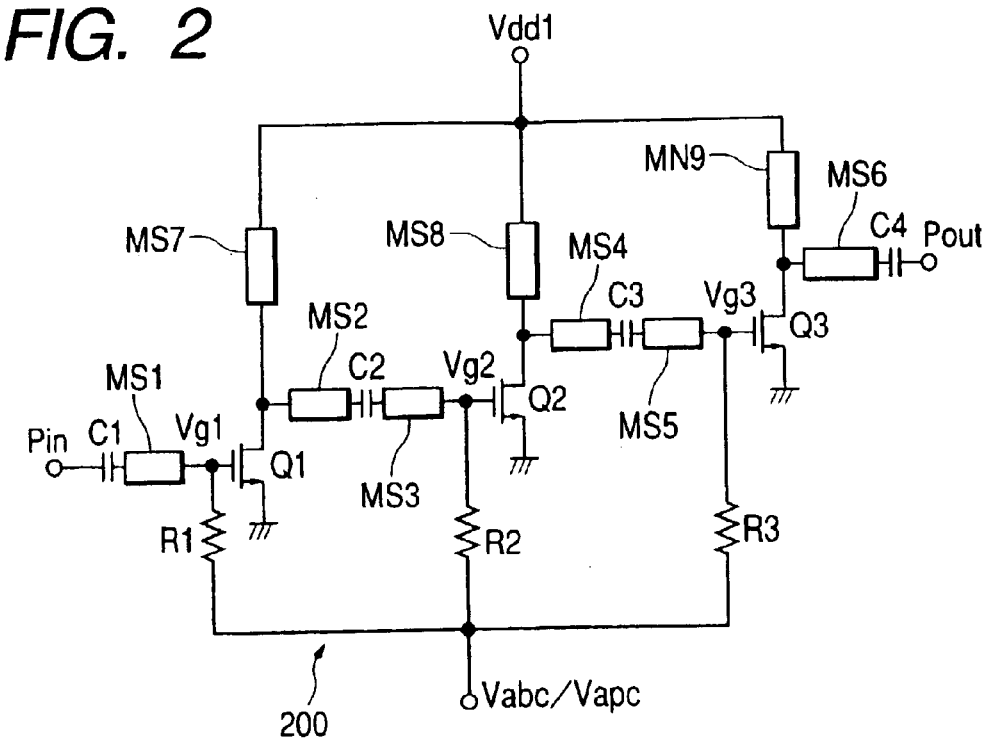
FIG. 2 is a circuit configurational diagram illustrating a specific example of an amplifying circuit section of the high frequency power amplifier according to an embodiment.

FIG. 2 shows an example of a circuit configuration of the high frequency power amplifier 210.

The high frequency power amplifier 210 according to the present embodiment has a structure wherein a plurality of field effect transistors are sequentially cascade-connected as active elements to form a multistage configuration on a circuit basis. Namely, the high frequency power amplifier takes a three-stage configuration wherein a gate terminal of a middle-stage transistor Q2 is connected to a drain terminal of a first-stage transistor Q1, and a gate terminal of a final-stage transistor Q3 is connected to a drain terminal of the middle-stage transistor Q2.

In the high frequency power amplifier 210 shown in FIG. 2, a high-frequency signal Pin is inputted to a gate terminal of the first-stage transistor Q1 through a capacitive element C1. A drain terminal of the final-stage transistor Q3 is connected to an output terminal Pout through a capacitive element C4. Thus, the high frequency power amplifier cuts a dc component of the high-frequency input signal Pin and amplifies an ac component thereof, followed by its output. An output level at this time is controlled by the bias circuit 214 and the power supply voltage Vdd1 outputted from the power control circuit 221. The power supply voltage Vdd1 is connected to the drain terminals of the power amplifying transistors 211, 212 and 213. As an alternative to it, a combinational method such as a connection of the transistors 212 and 213 alone, a connection of the transistors 211 and 213 alone or a connection of the transistor 213 alone is also considered. Further, the optimum control system by application is also allowed. In this case, the transistors disconnected from Vdd1 are connected to a constant voltage source.

The bias circuit 214 is made up of resistors R1, R2 and R3. The control voltage Vabc outputted from the bias voltage generating circuit 222 or the output level control voltage Vapc supplied via the switch SW2 is supplied to the gates of the transistors Q1, Q2 and Q3 through the resistors R1, R2 and R3, so that bias voltages Vg1, Vg2 and Vg3 are applied thereto. These resistors R1, R2 and R3 serve so as to prevent the high-frequency input signal from leaking to the bias voltage generating circuit 222.

Incidentally, signs MS1 through MS6 in FIG. 2 respectively indicate microstrip lines which act as inductance elements for matching impedances between the respective stages. Signs MS7 through MS9 respectively indicate microstrip lines for matching impedances between the high frequency power amplifier and the power control circuit 221. The condensers C1, C2, C3 and C4 series-connected to the microstrip lines MS1 through MS6 serve so as to cut off dc voltages of the power supply voltage Vdd1 and the gate bias voltages (Vg1, Vg2 and Vg3).

In the high frequency power amplifier 210 according to the present embodiment, although not restricted in particular, the final-stage transistor Q3 comprises a discrete part (output power MOSFET or the like), and the first-stage and middle-stage transistors Q1 and Q2 and the bias circuit 214 for generating the gate bias voltages Vg1, Vg2 and Vg3 are configured on one semiconductor chip as a semiconductor integrated circuit.

Further, the semiconductor integrated circuit and the elements such as the condensers C1, C2, C3 and C4, etc. are packaged on a common ceramic substrate and configured as a module. The microstrip lines MS1 through MS9 are formed in conductive layer patterns such as copper or the like formed so as to assume desired inductance values, on a ceramic substrate equipped with a semiconductor chip formed with, for example, the transistors Q1 and Q2 and the resistors R1 through R3 constituting the bias circuit 214.

Incidentally, while FIG. 2 shows one having the simplest configuration comprising the resistors R1 through R3 alone as the bias circuit 214 by way of example, a bias circuit including, for example, a circuit for generating a temperature-compensated bias voltage, a circuit for correcting a shift in bias voltage due to variations in element, etc. may be used except for the above.

Figure 3:
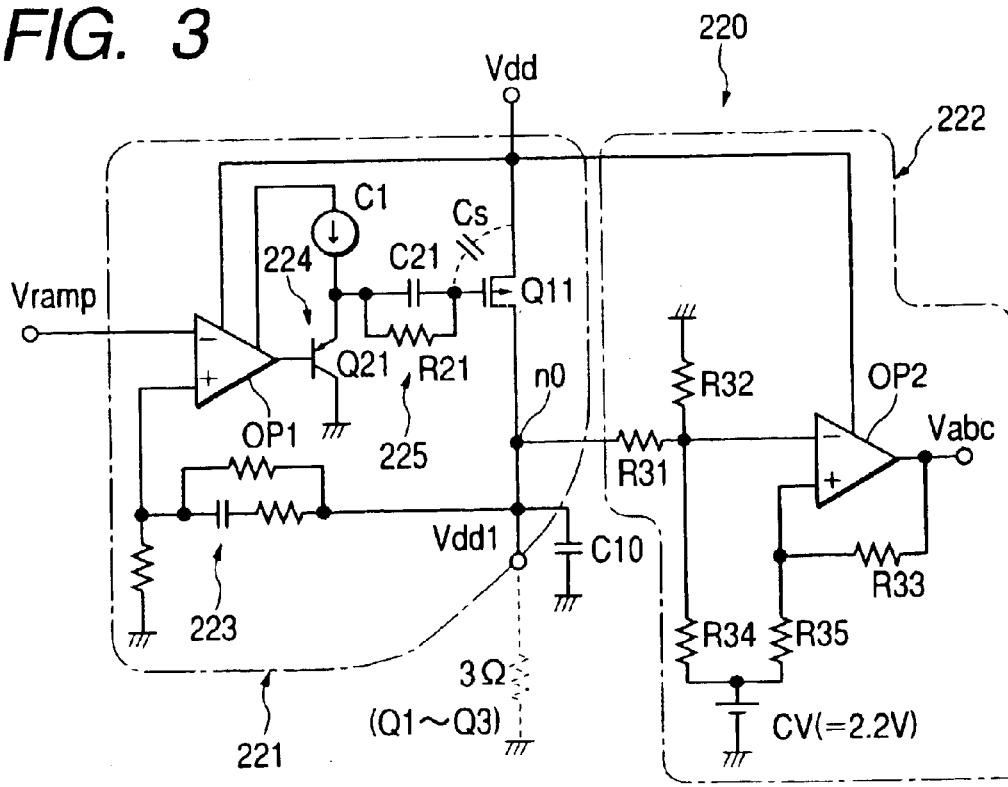
FIG. 3 is a circuit configurational diagram depicting a specific example of an operating voltage control circuit of the high frequency power amplifier according to the embodiment.

FIG. 3 shows specific circuit configurational examples of the power control circuit 221 and the bias voltage generating circuit 222.

In FIG. 3, Vramp indicates an output level designation signal VPL supplied from the base band circuit via the switch SW1 or an amplitude information signal LDO supplied from the comparator 431. The power control circuit 221 comprises an op amplifier (operational amplifier circuit) OP1 which receives Vramp as an input, a P-channel MOSFET Q11 controlled by the output of the op amplifier OP1 and set so as to take out an output voltage Vdd1 from a drain terminal thereof, a feedback circuit 223 made up of a CR circuit, which effects feedback from the drain terminal of the P-channel MOSFET Q11 to a non-inversion input terminal of the op amplifier OP1, a buffer circuit 224 and a phase compensating circuit 225 provided between the op amplifier OP1 and a gate terminal of the MOSFET Q11, and a smoothing capacitor C10 for stabilizing an output.

Owing to the feedback of the output voltage Vdd1 to the non-inversion input terminal of the op amplifier OP1 via the CR circuit 223, the power control circuit 221 employed in the present embodiment is configured so as to output the voltage Vdd1 which changes substantially linearly with respect to the input voltage Vramp. Incidentally, the P-channel type is used as the output MOSFET Q11 because the output power supply voltage Vdd1 can be raised up to near a source or power supply voltage Vdd as compared with an N-channel type MOSFET. It is therefore possible to reduce power losses.

The buffer circuit 224 comprises a pnp bipolar transistor Q21 whose base terminal is connected to an output terminal of the op amplifier OP1, and a constant current source CI connected to the emitter side of the transistor Q21, and operates as an emitter follower. Since the output MOSFET Q11 is designed so as to become large in device size to allow a large current to flow in the output power FETs Q1 through Q3, a capacitance Cs parasitic to its gate becomes relatively large. Incidentally, the constant current source CI shown in the same drawing is one in which a current supplied from the op amplifier OP1 to the emitter of the transistor Q21 is represented as a current source.

Thus, since the op amplifier OP1 must drive the gate parasitic capacitance Cs when no buffer circuit 224 is provided, the amplitude information signal LDO is inputted as the input voltage Vramp when the power control circuit 221 is operated in the EDGE modulation mode, and a response at the time of a change in the signal becomes slow. On the other hand, the power control circuit 221 employed in the embodiment is provided with the buffer circuit 224 and is capable of causing a current to forcibly flow into or pull in the gate parasitic capacitance Cs of the output MOSFET Q11 from the constant current source CI when the voltage applied to the gate of the output MOSFE Q11 is raised, and of causing the current to pull out from the gate parasitic capacitance Cs by a collector current of the transistor Q21. As a result, a high-speed operation is enabled.

The phase compensating circuit 225 comprises a capacitor C21 and a resistor R21 connected in parallel between the emitter terminal of the transistor Q21 and the gate terminal of the output MOSFET Q11. Since the power control circuit 221 is given a phase allowance owing to the provision of the phase compensating circuit 225, a cutoff frequency is improved and gain, i.e., the ratio between input amplitude and output amplitude can be made constant up to a desired frequency when the power control circuit 221 is operated in the EDGE modulation mode.

Figure 5:
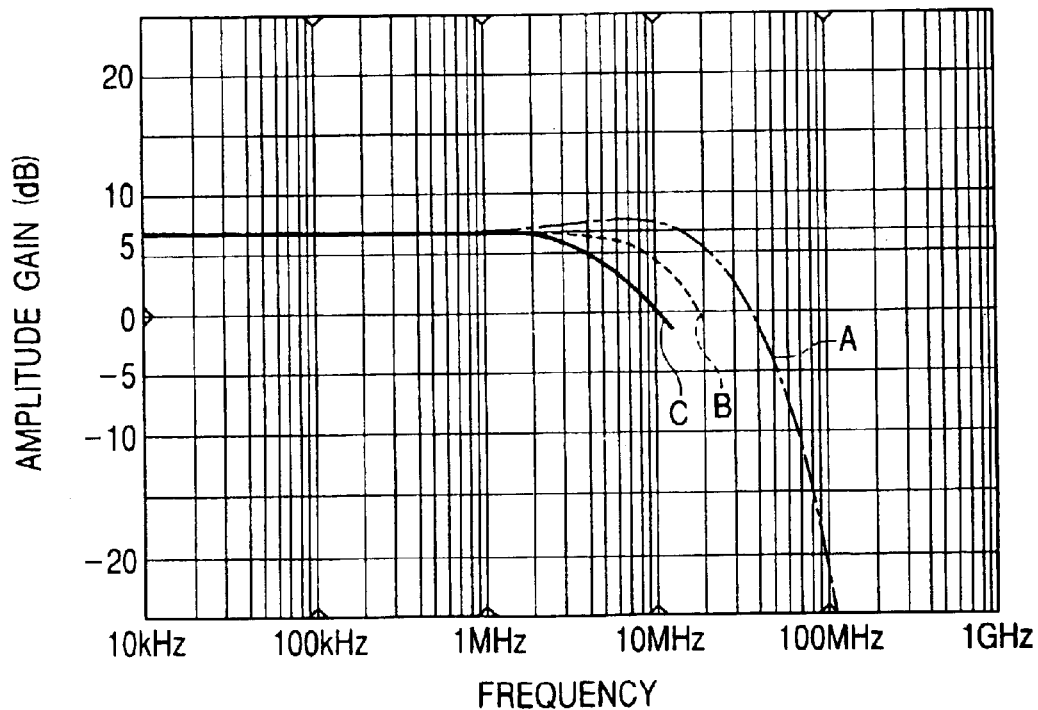
FIG. 5 is a graph showing a frequency characteristic of the operating voltage control circuit of the high frequency power amplifier according to the embodiment.

As to the power control circuit 221 having the buffer circuit 224 and the phase compensating circuit 225, a frequency characteristic obtained by connecting an equivalent resistor (3 Ω) to an output terminal for the control voltage Vdd1 as an alternative to the output power FETs Q1 through Q3 and performing a simulation in this state, a circuit's frequency characteristic obtained where the phase compensating circuit 225 is omitted from the power control circuit 221 employed in the embodiment and only the buffer circuit 224 is included, and a circuit's frequency characteristic obtained where the phase compensating circuit 225 and the buffer circuit 224 are omitted from the power control circuit 221 employed in the embodiment, are respectively represented in FIG. 5 by a chain line A, a broken line B and a solid line C. It is understood from FIG. 5 that the cutoff frequency extends in a high direction owing to the insertion of the buffer circuit 224 and the phase compensating circuit 225.

In the present embodiment, the transmit signal is separated into the phase and amplitude in the EDGE modulation mode. The phase is shifted by an unillustrated PLL circuit, whereas the amplitude is set by shifting the power supply voltage for the high frequency power amplifier by the power control circuit 221 based on the amplitude information signal LDO. Thus, since a distinction between the amount of the present phase shift and the amount of a phase shift based on phase modulation is not made when the phase is heavily shifted upon such amplitude control, the phase allowance may preferably be given to the power control circuit 221 as described above.

Figure 4:
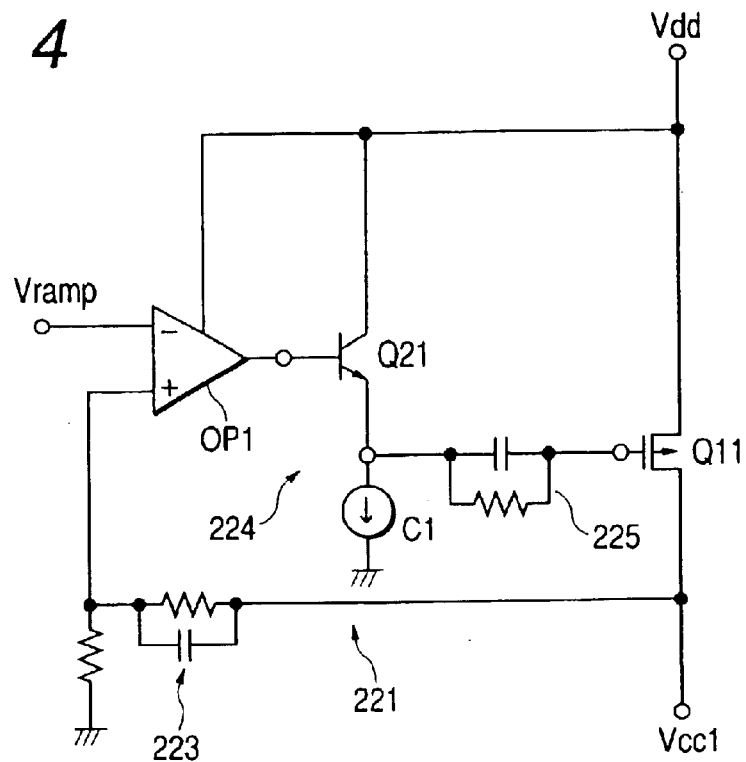
FIG. 4 is a circuit diagram showing an example of a power control circuit discussed upon execution of the present invention.

Incidentally, when the P-channel MOSFET is used as the MOSFET Q11 as in the embodiment, a pnp type may desirably be used as the bipolar transistor Q21 constituting the buffer circuit 224. This is because when the pnp type is used as the transistor Q21, the gate voltage of the MOSFET Q11 can be raised to a voltage reduced by a voltage drop developed by an internal resistance Re of the constant current source CI from the power supply voltage Vdd, whereas a buffer circuit having such a configuration as shown in FIG. 4, using an npn type is used, the gate voltage of the MOSFET Q11 is simply raised to a voltage reduced by a base-emitter voltage Vbe (about 0.7V) of the npn transistor from the power supply voltage Vdd even if the output of an op amplifier OP1 has reached the power supply voltage Vdd, and a power supply voltage Vdd1 to be outputted is also reduced correspondingly.

The bias voltage generating circuit 222 shown in FIG. 3 will next be explained. The bias voltage generating circuit 222 comprises an op amplifier OP2 whose non-inversion input terminal is input-connected to an output node n0 of the power control circuit 221 through a resistor R31, a resistor R32 connected between the non-inversion input terminal of the op amplifier OP2 and the power supply voltage Vdd, a feedback resistor R33 connected between an output terminal of the op amplifier OP2 and an inversion input terminal thereof, and a constant voltage source CV connected to the respective input terminals of the op amplifier OP2 via resistors R34 and R35. The constant voltage source CV is configured so as to supply a constant voltage of 2.2V, for example. Thus, the bias voltage generating circuit 222 operates as a voltage follower having an offset and outputs a voltage Vabc proportional to the input voltage Vdd1 according to a proportionality factor determined by a resistance ratio between the resistors R31 through R35.

Figure 6:
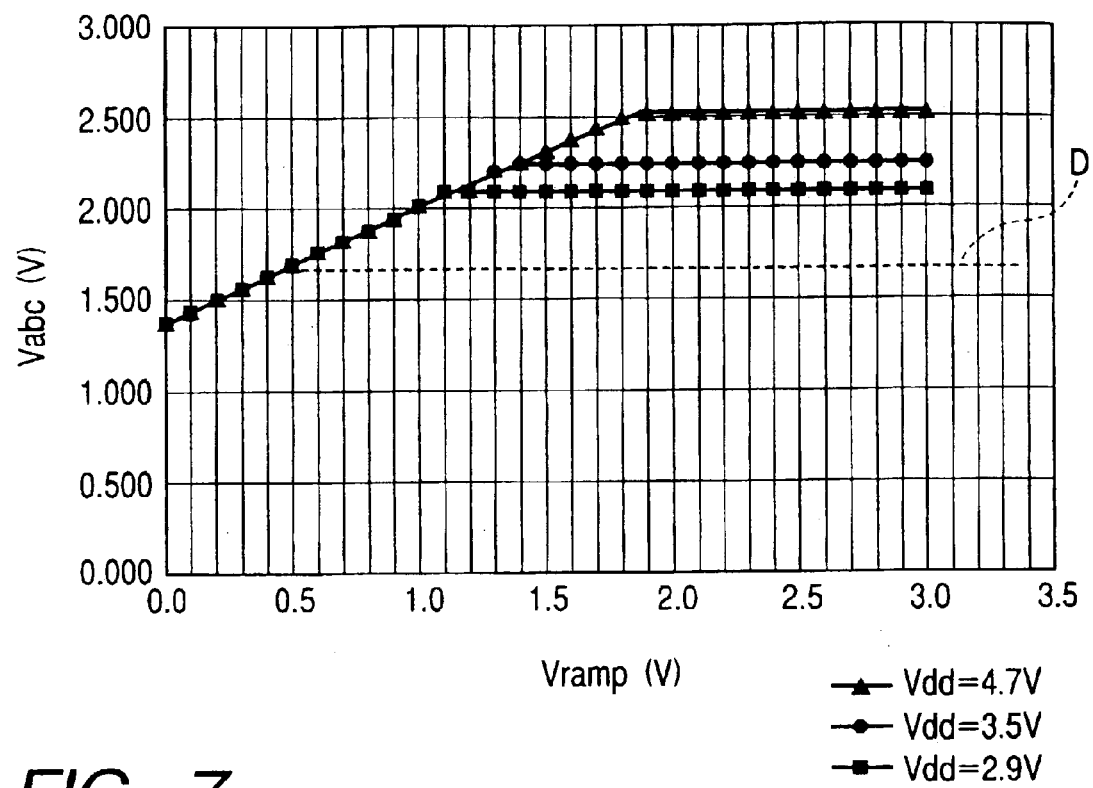
FIG. 6 is a graph illustrating an input/output characteristic of the operating voltage control circuit employed in the embodiment.

FIG. 6 shows an input/output characteristic of the operating voltage control circuit 220 employed in the embodiment. In the drawing, the horizontal axis indicates the voltage Vramp inputted to the power control circuit 221, and the vertical axis indicates the voltage Vabc outputted from the bias voltage generating circuit 222. The same drawing shows the relationship between the input voltage Vramp and the output voltage Vabc where the power supply voltage Vdd is set to 4.7V, 3.5V and 2.9V. In FIG. 6, ▲ marks show the relationship between the input voltage Vramp and the output voltage Vabc when the power supply voltage Vdd is 4.7V, ♦ marks show the relationship between the input voltage Vramp and the output voltage Vabc when the power supply voltage Vdd is 3.5V, and ■ marks show the relationship between the input voltage Vramp and the output voltage Vabc when the power supply voltage Vdd is 2.9V, respectively.

In the same drawing, an initial output voltage (about 1.4V) at the time that the input voltage Vramp is 0V, is determined according to the ratio between the constant voltage of the constant voltage source CV and the resistors R32 through R35. Thus, the initial voltage at the time that the input voltage Vramp is 0V, is supplied and the bias voltage Vabc outputted based on the initial voltage is changed, thereby making it possible to linearly change an output level in proportion to the input voltage Vramp while a desired output level is being supplied even in a region in which the input voltage Vramp is low.

Incidentally, the output voltage Vdd1 of the power control circuit 221 with respect to the input voltage Vramp is substantially similar to FIG. 6 in its change and different therefrom only in that the inclination of a straight line is large than one shown in FIG. 6. Therefore, its illustration will be omitted. The ratio between a constant voltage Vapc1 and the resistors R32 through R35 is suitably set in such a manner that the output voltage Vabc of the operating voltage control circuit 220 is clamped at a point Q equivalent to a point where an input/output temperature characteristic curve at a high temperature intersect an input/output temperature characteristic curve at a low temperature, thereby making it possible to generate such a bias voltage Vabc that input/output characteristics of the output power FETs Q1 through Q3 are not varied due to temperature compensation, i.e., a change in temperature.

The input/output characteristic of the operating voltage control circuit 220 where the bias voltage Vabc is clamped by a voltage (e.g., 1.6V) at the point Q, is represented by a broken line D in FIG. 6. Incidentally, the voltage at the point Q varies according to a circuit configuration, a used process, etc. and is not limited to 1.6V as shown in FIG. 6. When the bias voltage Vabc is clamped at the point Q, an operation stable with respect to a change in temperature can be ensured. However, as compared with the non-execution of its clamp, the output level becomes slightly low and the efficiency is also reduced in a region in which it is desired to increase the output level. Therefore, a decision as to whether the bias voltage should be clamped, may be made depending on to which characteristic one desires to give a high priority.

Figure 7:
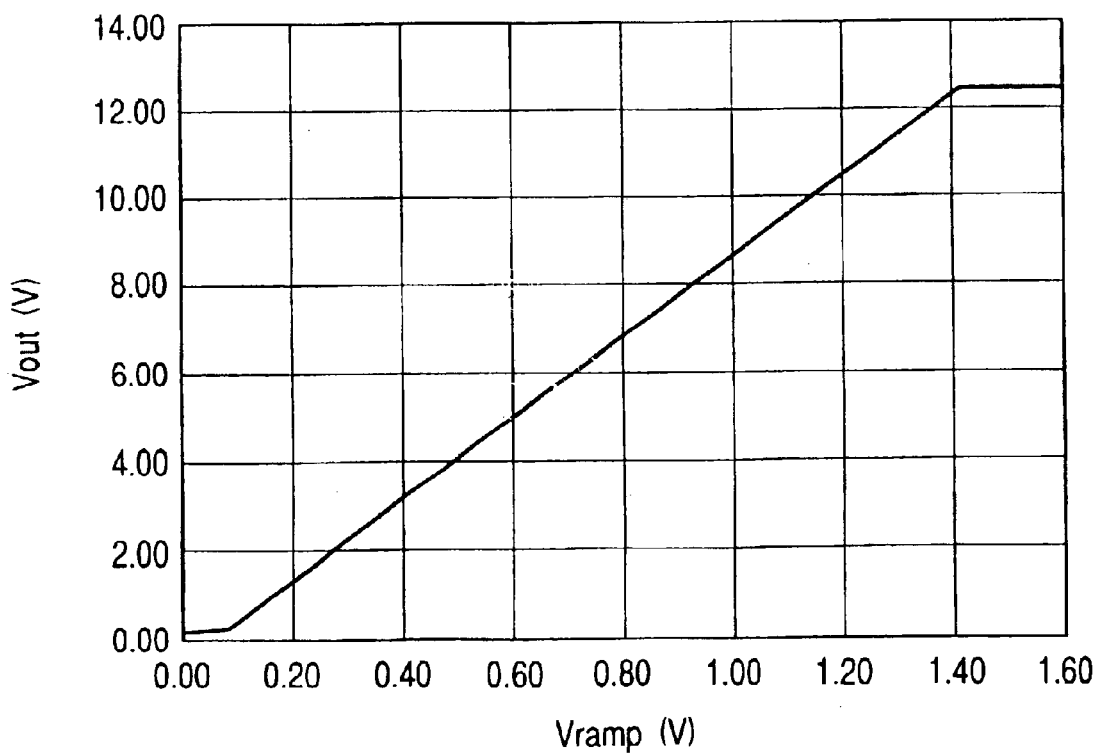
FIG. 7 is a graph depicting an input/output characteristic of the high frequency power amplifier according to the embodiment.

The above-described power supply voltage Vdd1 and bias voltage Vabc are supplied to the high frequency power amplifier so that the output Vout of the high frequency power amplifier 210 changes substantially linearly as shown in FIG. 7 with respect to the change in the input voltage Vramp. Further, the efficiency of the high frequency power amplifier 210 is represented as indicated by a solid line a of FIG. 8 owing to the supply of the bias voltage Vabc to the bias circuit 214. On the other hand, when a fixed voltage is supplied to the bias circuit 214 as an alternative to the bias voltage Vabc of such a characteristic as shown in FIG. 6, the efficiency of the high frequency power amplifier 210 is represented as indicated by a broken line b of FIG. 8. As the solid line a and the broken line b are compared, it is understood that the efficiency of the high frequency power amplifier 210 increases in a low output region owing to the use of the bias voltage generating circuit 222 employed in the present embodiment.

The reason why the efficiency is considered to be improved in this way, resides in that the input voltage Vramp is reduced when the fixed bias voltage is supplied, and the gate-drain voltages of the output power FETs Q1 through Q3 are reduced when the power supply voltage Vdd1 is lowered, so that the amplification factor of each FET is extremely degraded, whereas when the gate bias voltage Vabc is also reduced according to a reduction in the power supply voltage Vdd1 when the power supply voltage Vdd1 is lowered as in the present embodiment, the gate-drain voltages of the output MOSFETs Q1 through Q3 are kept great in the low region of the power supply voltage Vdd1 as compared with the fixed bias voltage, thereby making it possible to avoid the extreme reduction in the amplification factor of each FET.

Figure 8:
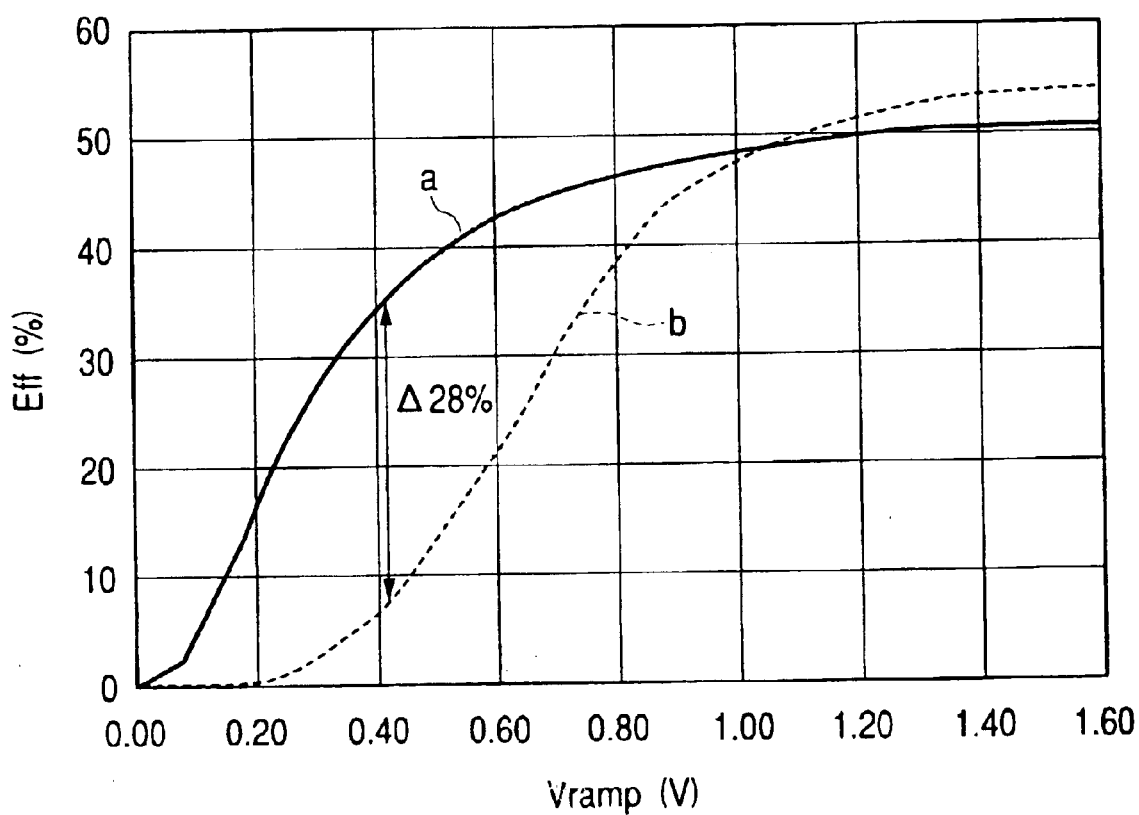
FIG. 8 is a graph showing the relationship between an input voltage of the high frequency power amplifier according to the embodiment and the efficiency thereof.

Incidentally, as is understood by making reference to FIG. 8, the efficiency is slightly reduced in a high region of the power supply voltage Vdd1 as compared with the fixed bias by application of the present embodiment. However, since a cellular phone is often used at a low output rather than used at a high output, the effect of suppressing the total power consumption owing to an improvement in the efficiency in the low output region as in the embodiment can be expected.

Figure 13:
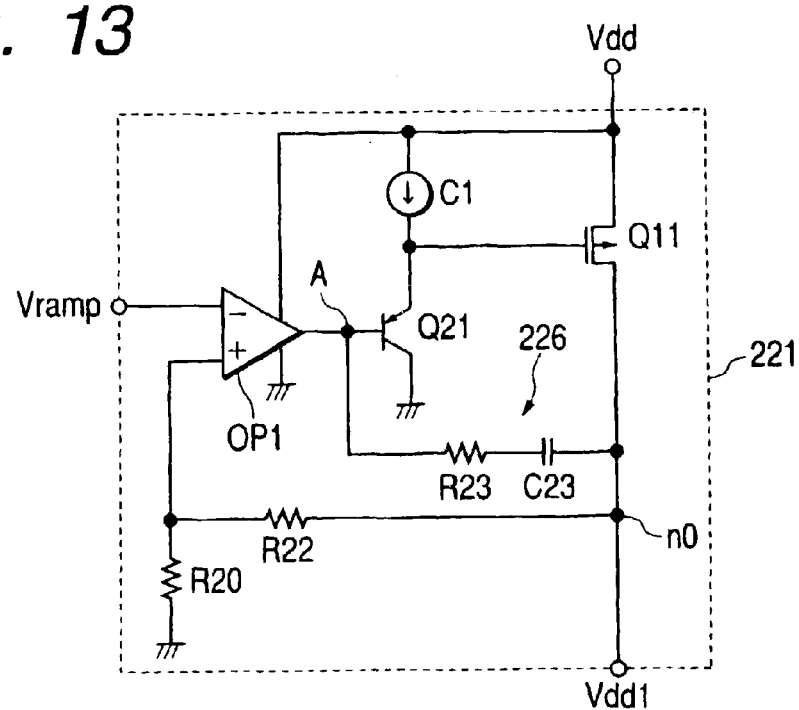
FIG. 13 is a circuit diagram illustrating another embodiment of a power control circuit.

FIG. 13 shows another embodiment of a power control circuit 221 for generating a power supply voltage Vdd1 applied to the drain terminal of each output power FET employed in the above-described embodiment. The power supply control circuit 221 employed in the embodiment makes use of a P-channel type MOSFET as an alternative to the N-channel type MOSFET as the output MOSFET Q11 in the power control circuit 221 employed in the embodiment shown in FIG. 3, and is provided with a phase compensating circuit 226 wherein a capacitor C23 and a resistor R23 are series-connected between a source terminal of an output MOSFET Q11 and a base terminal of a transistor Q21 as an alternative to the phase compensating circuit 225 comprising the capacitor C21 and the resistor R21 parallel-connected between the emitter terminal of the transistor Q21 and the gate terminal of the output MOSFET Q11.

In the power control circuit 221 employed in the present embodiment, the gain is determined according to the ratio between a resistor R20 provided between a non-inversion input terminal of an op amplifier OP1 and a ground point and a feedback resistor R23 provided between the non-inversion input terminal of the op amplifier OP1 and an output node n0. The phase compensating circuit 226 aims to prevent the oscillations of a feedback loop of the whole circuit. A point A and the output node n0 are opposite in phase. Feeding back an antiphase signal from the output node n0 to the base of the transistor Q21 via the capacitor C23 and the resistor R23 allows prevention of loop's oscillations. Assuming that the impedance of the capacitor C23 and the resistor R23 is given as Z0, and a parallel impedance of an output impedance of the op amplifier OP1 as viewed from the phase compensating circuit and an input impedance of the buffer PNP transistor Q21 is given as Zin, the amount of feedback is represented as Zin/(Zin+Z0). Changing this constant makes it possible to vary a circuit's frequency characteristic.

Figure 9:
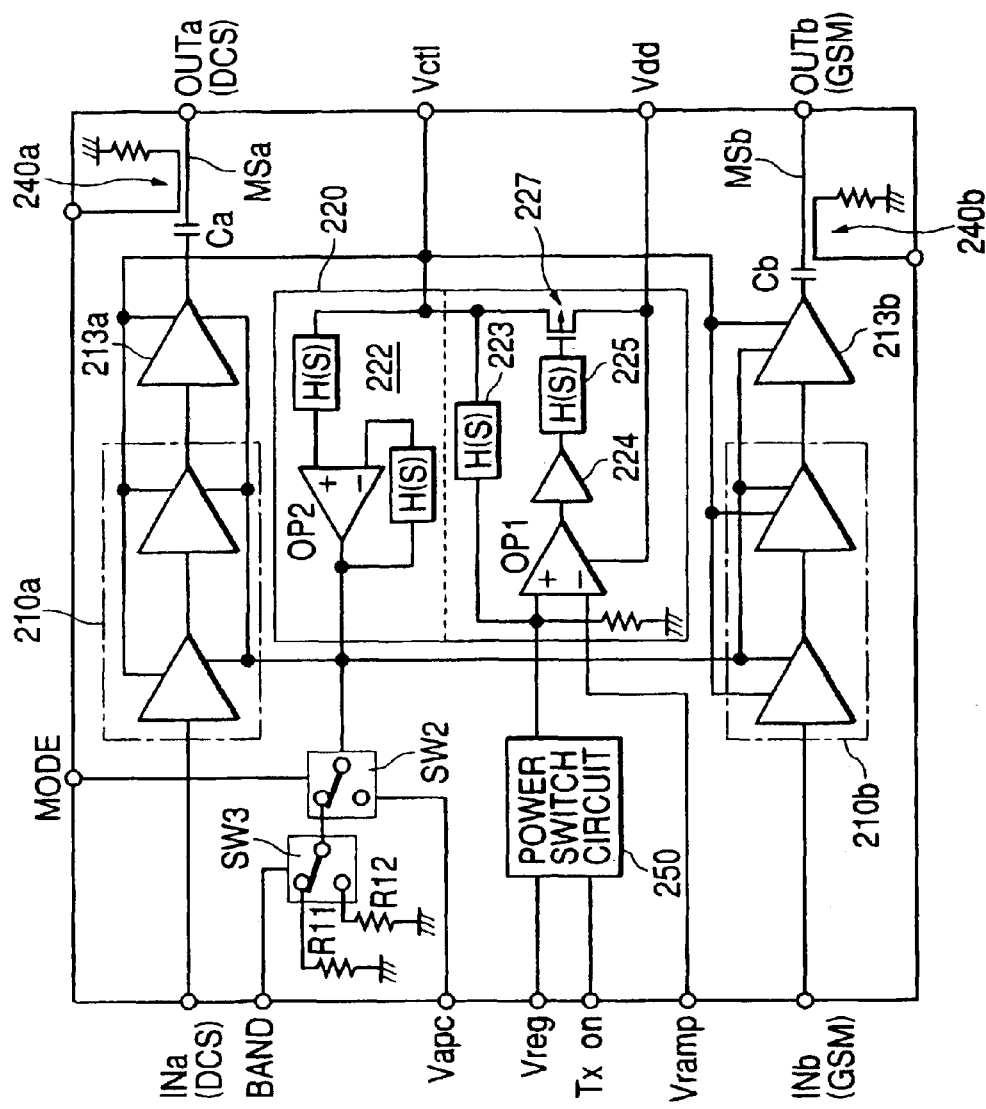
FIG. 9 is a block diagram illustrating a configurational example of an RF power module using the high frequency power amplifier according to the embodiment.

FIG. 9 shows an embodiment in which the operating voltage control circuit 220 and high frequency power amplifier 210 according to the above-described embodiment are mounted on one ceramic substrate and configured as an RF power module.

In FIG. 9, designated at each of numerals 210a and 210b is one in which the output power transistors Q1 and Q2 of the initial stage and middle stage of the high frequency power amplifier 210 shown in FIG. 2 are respectively configured on one semiconductor chip as a semiconductor integrated circuit (hereinafter called "power amp IC"). Designated at each of numerals 213a and 213b is one wherein the final-stage transistor Q3 is made up of a discrete part (output power MOSFET). One (upper stage) of the two is used for a DCS (Digital Cellular System) and the other (low stage) thereof is used for a GSM. Reference numeral 220 indicates an operating voltage control circuit having such a configuration as shown in FIG. 3 and brought to a semiconductor integrated circuit. In the present embodiment, the operating voltage control circuit is provided as a circuit common to a power amplifier for the DCS and a power amplifier for the GSM.

Further, SW2 in FIG. 9 is a selector switch for inputting an output level control voltage Vapc supplied from an unillustrated base band circuit or modem circuit as an alternative to the power supply voltage Vdd1 generated by the operating voltage control circuit 220 to the operating voltage control circuit 220. The selector switch SW2 performs switching according to a mode signal MODE for designating or specifying a modulation system, which is supplied from the base band circuit. Thus, the RF power module according to the present embodiment is configured so as to be capable of performing transmission of a GMSK modulation system and transmission of an EDGE modulation system at two bands for the GSM and DCS respectively.

Therefore, in the module according to the present embodiment, output terminals of the output power MOSFETs Q3a and Q3b are respectively connected to output terminals OUTa and OUTb of the module via condensers Ca and Cb. Such connections are configured by microstrip lines MSa and MSb made up of conductive layer patterns formed on a ceramic substrate. Couplers 240a and 240b made up of conductor layers formed so as to be opposite to each other with a dielectric layer interposed therebetween are provided in the course of the microstrip lines MSa and MSb used as output lines used therefor.

Of these, reference numeral 240a indicates the coupler used in an EDGE modulation mode at the DCS band, and reference numeral 240b indicates the coupler used in the EDGE modulation mode at the GSM band. The couplers 240a and 240b may be configured separately from the RF power module. Owing to the provision of the couplers 240a and 240b on the ceramic substrate equipped with the high frequency power amplifier 210 as described above, the number of parts can be reduced and a cellular phone using the corresponding module can be brought into less size.

Further, the module according to the present embodiment is provided with resistors R11 and R12 and a selector switch SW3 used to perform switching between an initial bias voltage used upon GSM-type transmission and an initial bias voltage used upon DCS-type transmission in order to allow transmission of a GMSK modulation system at the two bands for the GSM and DCS. The selector switch SW3 serves so as to perform switch control according to a band changeover signal BAND for the GSM and DCS.

Incidentally, reference numeral 250 indicates a power switch circuit for activating and deactivating the operating voltage control circuit 220. Txon indicates a terminal inputted with a signal for controlling the power switch circuit 250. Vreg indicates a power terminal to which an operating voltage supplied to the operating voltage control circuit 220 via the power switch circuit 250 is applied. The power terminal serves so as to stop the operation of the operating voltage control circuit 220 when the operating voltage (Vreg) to be applied to the operating voltage control circuit 220 is blocked or cut off by the power switch circuit 250. In order to allow the power amplifier ICs 210a and 210b and power MOSFETs Q3a and Q3b to operate at an externally directly-supplied voltage even in such a state, there is provided a power terminal Vctl.

Figure 10:
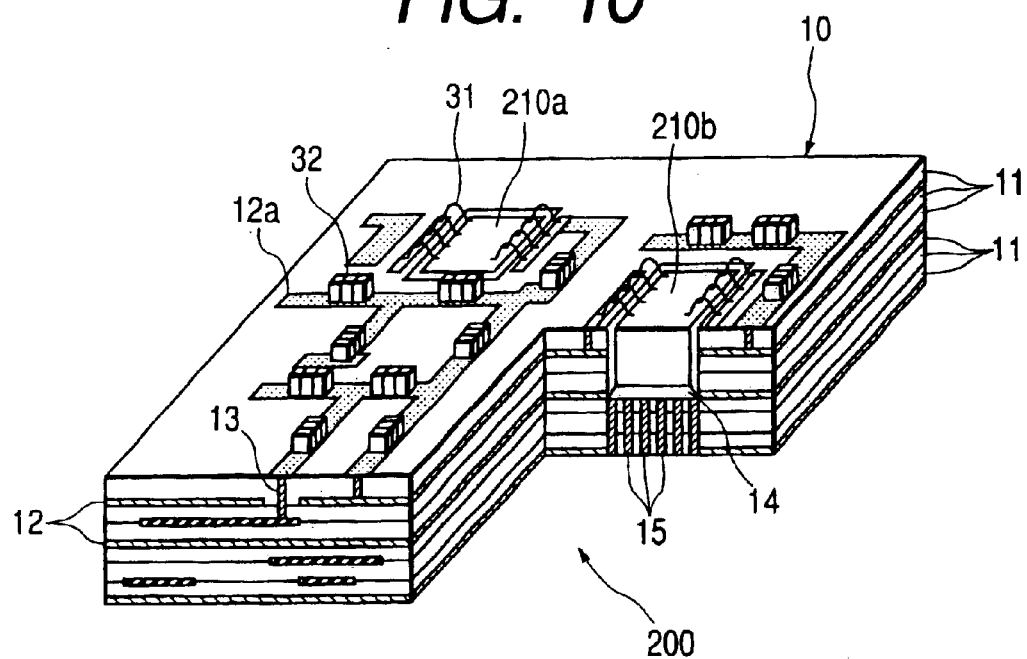
FIG. 10 is a partly sectional perspective view showing one example of a device structure of the RF power module shown in FIG. 9.

FIG. 10 shows a device structure of the RF power module 200 according to the embodiment. Incidentally, FIG. 10 is not intended for accurate representation of the structure of the RF power module according to the embodiment but shows a structural drawing from which some parts and wirings or the like are omitted, as its outline is understood.

As shown in FIG. 10, a main body 10 of the module according to the embodiment is configured as a structure wherein a plurality of dielectric plates 11 each made up of a ceramic plate such as alumina are laminated on one another and integrated into one piece. Conductor layers 12 each made up of a conductor such as copper, which is formed in a predetermined pattern and whose surface is given gold plating, are provided on the surfaces or back surfaces of the dielectric plates 11. Reference numeral 12a indicates a wiring pattern made up of the conductor layer 12. The aforementioned microstrip wirings MSa and MSb or the like are made up of wiring patterns. The couplers 240a and 240b are respectively made up of, for example, the wiring pattern 12a on the substrate surface and the conductor layers 12 lying inside the substrate, which are disposed in parallel with the dielectric plates 11 with the dielectric plates interposed therebetween. Further, holes 13 called "through holes" are defined in the respective dielectric plates 11 to connect the conductor layers 12 or wiring patterns on the obverse and reverse sides of the respective dielectric plates 11 to one another. Conductors are charged into the holes.

In the module according to the embodiment of FIG. 10, the six dielectric plates 11 are laminated on one another. The conductor layers 12 are formed on the sides of the back surfaces corresponding to the first, third and sixth layers as viewed from above over substantially the whole surfaces thereof. They are formed as ground layers for supplying a ground potential GND, respectively. Further, the conductor layers 12 lying on the obverse and reverse sides of the remaining respective dielectric plates 11 are used to constitute transmission lines or the like. By suitably setting the width of each conductor layer 12 and the thickness of each dielectric plate 11, each transmission line is configured so that its impedance becomes 50 Ω.

The dielectric plates 11 corresponding to the first to third layers are provided with a rectangular hole to locate the power amplifier IC 210a for the DCS system and the power amplifier IC 210b for the GSM system. The respective ICs are inserted inside the hole and fixed by a bonding material 14. Further, holes 15 called "viaholes" are defined in the dielectric plate 11 corresponding to the fourth layer equivalent to the bottom of the hole and the respective dielectric plates 11 located on the downside of the dielectric plate 11. Conductors are charged even into the holes 15. The conductors lying within the viaholes serve so as to transfer heat generated at the ICs 210a and 210b to the conductor layer corresponding to the lowest layer to thereby increase efficiency of thermal radiation.

Upper electrodes of the ICs 210a and 210b and the predetermined conductor layers 12 are electrically connected by their corresponding bonding wires 31. Chip type electronic parts 32 such as capacitive elements, resistive elements, diode elements, transistor elements, etc. for constituting the rectifying circuit and power switch circuit 250 or the like are mounted on the surface of the dielectric plate 11 of the first layer in plural form. Incidentally, the capacitive elements of these elements may be formed inside the substrate using the conductor layers on the obverse and reverse sides of the dielectric plates 11 without utilizing the electronic parts.

Figure 11:
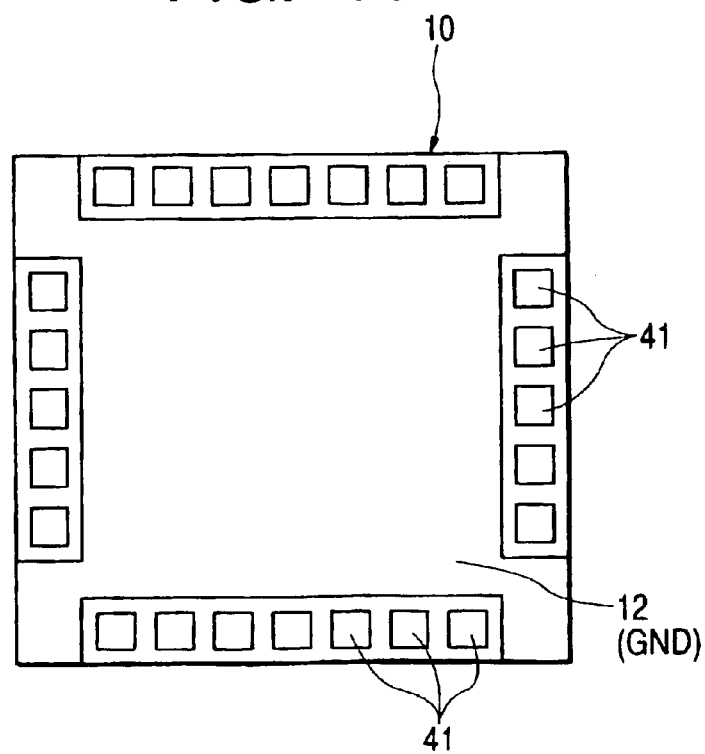
FIG. 11 is a bottom view illustrating a configurational example of a back surface of the module according to the embodiment.

External terminals for achieving electrical connections by packaging the module according to the present embodiment on a printed circuit board are provided as electrode pads 14 each comprised of the conductor layer, which are formed on the back surface of the module body 10 in predetermined forms as shown in FIG. 11. They are configured so as to be capable of being mounted on the printed circuit board with solder balls or the like interposed between the electrode pads and their corresponding portions (part of wirings or conductor layer connected to wirings) provided on a printed circuit board of each system.

Incidentally, the layout and shapes of the electrode pads 41 shown in FIG. 11 are illustrated by way of example. They are not limited to such one example. In FIG. 11, the conductor layer 12 used as the ground layer for supplying the ground potential is formed at portions other than the electrode pads 41 over substantially the whole surface.

Figure 12:
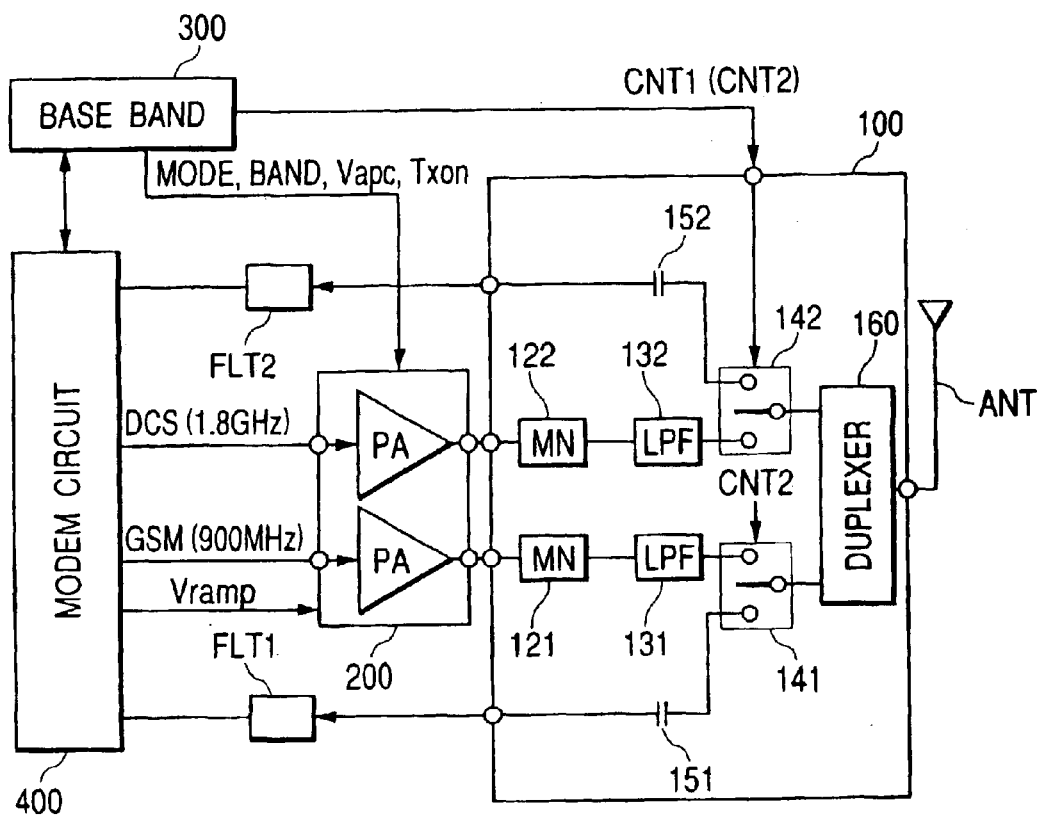
FIG. 12 is a block diagram showing the whole configuration of a cellular phone using the RF power module according to the embodiment.

FIG. 12 shows one embodiment of a dual band type cellular phone system capable of performing transmission and reception based on the two types for the GSM and DCS using the RF power module according to the above-described embodiment.

In FIG. 12, ANT indicates an antenna for transmitting and receiving a signal wave, reference numeral 100 indicates a front end module, reference numeral 200 indicates the RF power module according to the above embodiment, reference numeral 300 indicates a base band circuit for converting a voice signal to a base band signal, converting a receive signal to a voice signal and generating a modulation-system or mode switch signal and a band switch or changeover signal, reference numeral 400 indicates a modem LSI for downconverting the receive signal to demodulate it to thereby generate a base band signal and modulating a transmit signal, and FLT1 and FLT2 indicate filters for eliminating noise and interference from the receive signal.

Incidentally, for example, the filter FLT1 of these is configured as a circuit for the GSM, and the filter FLT2 thereof is configured as a circuit for the DCS. The base band circuit 300 can be made up of a plurality of LSIs and ICs such as a DSP (Digital Signal Processor), a microprocessor, a semiconductor memory, etc.

The front end module 100 comprises impedance matching circuits 121 and 122 connected to transmit output terminals of the RF power module 200 to perform impedance matching, low-pass filters 131 and 132 which attenuate harmonics, switch circuits 141 and 142 for transmit/receive changeover, capacitors 151 and 152 which cut a dc component from the receive signal, a duplexer 160 which performs demultiplexing of GSM-system signals lying in a 900 MHz band and DSC-system signals lying in a 1.8 GHz band, etc. These circuits and elements are mounted on one ceramic substrate and configured as a module. Changeover signal CNT1 and CNT2 of the transmit/receive selector switch circuits 141 and 142 are supplied from the base band circuit 300.

While the invention made above by the present inventors has been described specifically based on the illustrated embodiments, the present invention is not limited to the embodiments. It is needless to say that various changes can be made thereto within the scope not departing from the substance thereof. While the output transistors are connected in the three stages in the aforementioned embodiment, for example, they may be connected in a two-stage configuration or four-stage or more-stage configuration. While the above-described embodiment has described the case in which the final-stage output transistor Q3 is made up of another chip, it may be formed on the same chip as the bias circuit in a manner similar to other output transistors Q1 and Q2.

Further, while the aforementioned embodiment has described the high frequency power amplifier capable of performing communications based on the two systems corresponding to the GSM and DCS systems, the present invention can be applied to a triple band type high frequency power amplifier capable of handling signals of a PCS (Personal Communication System), which are lying in a 1850 to 1915 MHz band. Since the DCS and the PCS are relatively close to each other in frequency band in this case, the input and output terminals INa and OUTa shown in FIG. 9 and the high frequency power amplifiers 210a and 213a may be configured so as to be shared for the input/output of the signals for the DCS and PCS and the amplification of the signals.

Advantageous effects obtained by a typical one of the inventions disclosed in the present application will be described in brief as follows:

According to the present invention, a high frequency power amplifier capable of performing open-loop type transmission can be realized which is excellent in output linearity and good in efficiency at a low output. It is also possible to improve a response to a control voltage where a power supply voltage for each output power FET is controlled to thereby control an output level. Thus, a multifunction type high frequency power amplifier can be realized which is capable of performing transmission based on an EDGE modulation system for changing a power supply voltage for each output power FET based on amplitude information about a transmit signal to thereby add or effect amplitude control as well as a GMSK modulation system for phase-shifting the phase of a carrier wave according to transmit data. As a result, a cellular phone using a high frequency power amplifier according to the present invention brings about the effect of increasing a call time interval and the life of a battery.

What is claimed is:

1. A wireless communication module comprising:
    an insulated board including a plurality of conductor layers and a plurality of dielectric layers each of which is provided between the conductor layers:
    a high frequency power amplifier mounted on the insulated board and including:
        power amplifying transistors;
        a power control circuit which supplies a power supply voltage to the power amplifying transistors;
        a bias voltage generating circuit which generates a bias voltage applied to control terminals of the power amplifying transistors, and
    said wireless communication module further comprising a potential detector including a first conductor layer which is one of the plurality of conductor layers and to which an output of the high frequency power amplifier is applied and a second conductor layer which is one of the plurality of conductor layers and which includes a part arranged so as to be opposed to the first conductor layer, and adapted to detect a level of the output of the high frequency power amplifier,
    wherein the bias voltage generating circuit generates the bias voltage, based on the power supply voltage outputted from the power control circuit.

2. A wireless communication module comprising:
    an insulated board including a plurality of conductor layers and a plurality of dielectric layers each of which is provided between the conductor layers;
    a high frequency power amplifier mounted on the insulated board and including:
        power amplifying transistors which are coupled to each other in series so as to amplify a first signal:
        a power control circuit which receives a power voltage and a second signal and which supplies a power supply voltage in accordance with the second signal, to the power amplifying transistors;
        a bias voltage generating circuit which generates a bias voltage to be applied to control terminals of the power amplifying transistors; and
    said wireless communication module further comprising a potential detector including a first conductor layer which is one of the plurality of conductor layers and to which an output of the high frequency power amplifier is applied and a second conductor layer which is one of the plurality conductor layers and which includes a part arranged so as to be opposed to the first conductor layer, wherein a detect signal, which is provided from the second conductor layer, is used for forming the second signal in combination with data to be transmitted, and wherein the bias voltage generating circuit generates the bias voltage, based on the power supply voltage outputted from the power control circuit.

3. A wireless communication module according to claim 1, wherein the first conductor layer is a strip layer formed on the insulated board and the second conductor layer is a conductor layer formed in the inside of the insulated board.

4. A wireless communication module according to claim 2, wherein the first conductor layer is a strip layer formed on the insulated board and the second conductor layer is a conductor formed in the inside of the insulated board.

5. A wireless communication module according to claim 2, wherein the second signal is formed by comparing a signal based on the detect signal with a signal based on the data to be transmitted.

6. A wireless communication module according to claim 5, wherein each of the power amplifying transistors is a MOSFET.

7. A wireless communication module according to claim 6, wherein the first conductor layer is a strip layer formed on the insulated board and the second conductor layer is a conductor layer formed in the inside of the insulated board.

* * * * *